(12) United States Patent
Kamei et al.

(10) Patent No.: US 8,658,903 B2
(45) Date of Patent: Feb. 25, 2014

(54) WIRED CIRCUIT BOARD

(75) Inventors: Katsutoshi Kamei, Osaka (JP); Kouji Ichinose, Osaka (JP); Yuu Sugimoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 115 days.

(21) Appl. No.: 13/317,365

(22) Filed: Oct. 17, 2011

(65) Prior Publication Data
US 2012/0111608 A1 May 10, 2012

(30) Foreign Application Priority Data

Nov. 5, 2010 (JP) ................................. 2010-248466

(51) Int. Cl.
*H05K 1/00* (2006.01)
(52) U.S. Cl.
USPC ........................................ 174/254; 360/245.9
(58) Field of Classification Search
None
See application file for complete search history.

(56) References Cited

U.S. PATENT DOCUMENTS 4,796,132 A * 1/1989 Dekura et al. ........... 360/123.01
7,142,395 B2 * 11/2006 Swanson et al. ........... 360/245.9

| | | | |
|---|---|---|---|
| 2003/0026078 A1 | 2/2003 | Komatsubara et al. | |
| 2007/0137025 A1 | 6/2007 | Kubota et al. | |
| 2009/0151994 A1* | 6/2009 | Ohsawa et al. ............... | 174/261 |

FOREIGN PATENT DOCUMENTS

| | | |
|---|---|---|
| JP | 03-291948 A | 12/1991 |
| JP | 05-074853 A | 3/1993 |
| JP | 2003-31915 | 1/2003 |
| JP | 2007-173363 A | 7/2007 |

OTHER PUBLICATIONS

Japanese Notification of Reasons for Refusal, issued by JPO on Aug. 13, 2013, in connection with corresponding Japanese Patent Application No. 2010-248466.

* cited by examiner

*Primary Examiner* — Ishwarbhai B Patel
(74) *Attorney, Agent, or Firm* — Jean C. Edwards, Esq.; Edwards Neils PLLC

(57) ABSTRACT

A wired circuit board includes an insulating base layer, a conductive pattern that is laminated on the insulating base layer, and an insulating cover layer that is laminated on the insulating base layer so as to cover the conductive pattern. The conductive pattern includes, when projected in a laminating direction of the insulating base layer, the conductive pattern, and the insulating cover layer, a terminal portion that is exposed from the insulating base layer and the insulating cover layer. The terminal portion includes an exposed surface that is exposed toward an external terminal side. A protruded portion that protrudes toward the contact direction with the external terminal is formed on the exposed surface.

4 Claims, 3 Drawing Sheets

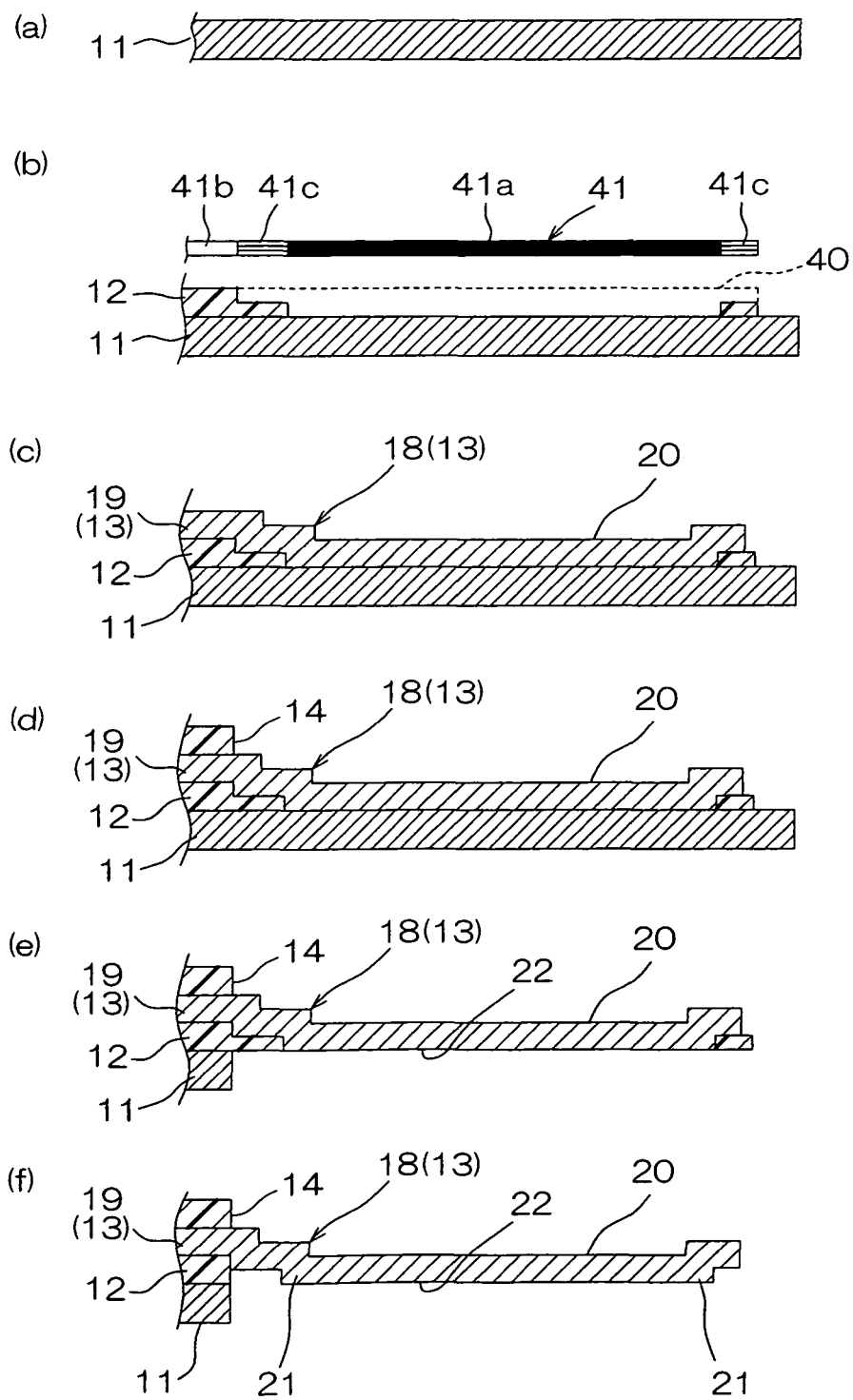

WIRED CIRCUIT BOARD

CROSS-REFERENCE TO RELATED APPLICATION

The present application claims priority from Japanese Patent Application No. 2010-248466 filed on Nov. 5, 2010, the contents of which are hereby incorporated by reference into this application.

BACKGROUND OF THE INVENTION

1. Field of the Invention

The present invention relates to a wired circuit board, to be specific, to a wired circuit board that is preferably used as a suspension board with circuit.

2. Description of Related Art

In a wired circuit board that is used in an electronic/electrical device and the like, a terminal portion so as to be connected to an external terminal is usually formed.

In recent years, as the terminal portion, in order to respond to high density growth and miniaturization of the electronic/electrical device, a so-called flying lead that is formed not only on one surface of a conductive pattern, but also on both surfaces thereof has been becoming common. For example, it has been known that in a suspension board with circuit and the like that is used in a hard disk drive, the terminal portion is formed as the flying lead.

For example, it has been disclosed that in the suspension board with circuit including a supporting board, a base layer that is formed on the supporting board, a conductive pattern that is formed on the base layer as a predetermined wired circuit pattern, and a cover layer covering the conductive pattern, the cover layer is formed to have an opening to expose the top surface of the conductive pattern, and the supporting board and the base layer are formed to have an opening to expose the back surface of the conductive pattern, so that the exposed conductive pattern is defined as the flying lead.

Then, for example, by using a bonding tool and the like, the flying lead is connected to an external terminal by applying ultrasonic vibration thereto (ref: for example, Japanese Unexamined Patent Publication No. 2003-31915).

SUMMARY OF THE INVENTION

In order to connect the flying lead described in Japanese Unexamined Patent Publication No. 2003-31915 to the external terminal, in a state where one surface of the flying lead is in contact with the external terminal, the bonding tool comes into contact with the other surface of the flying lead and the flying lead is pressed toward the external terminal with the bonding tool, and the ultrasonic vibration is applied thereto.

At this time, the pressing force due to the bonding tool is dispersed on one surface of the flying lead, so that the pressure of the flying lead with respect to the external terminal may be reduced. There is a disadvantage that when the pressure of the flying lead with respect to the external terminal is insufficient, a connection of the flying lead with respect to the external terminal becomes insufficient.

On the other hand, when the pressing force of the bonding tool is increased, while the connection strength is enhanced, a reduction in lifetime of the bonding tool is caused and an excessive stress is applied in the terminal portion.

It is an object of the present invention to provide a wired circuit board that is capable of sufficiently connecting a terminal portion with respect to an external terminal even though the pressing force of a bonding tool is not increased.

A wired circuit board of the present invention includes an insulating base layer, a conductive pattern that is laminated on the insulating base layer, and an insulating cover layer that is laminated on the insulating base layer so as to cover the conductive pattern, wherein the conductive pattern includes, when projected in a laminating direction of the insulating base layer, the conductive pattern, and the insulating cover layer, a terminal portion that is exposed from the insulating base layer and the insulating cover layer; the terminal portion includes an exposed surface that is exposed toward an external terminal side; and a protruded portion that protrudes toward the contact direction with the external terminal is formed on the exposed surface.

In the wired circuit board of the present invention, it is preferable that the protruded portion has a difference in level that is 80% or less with respect to the length in the laminating direction of the insulating base layer.

In the wired circuit board of the present invention, it is preferable that when the protruded portion is projected in the laminating direction, the area thereof is in the range of 10 to 90% with respect to that of the exposed surface.

According to the wired circuit board of the present invention, in the exposed surface of the terminal portion that is in contact with the external terminal, the protruded portion that protrudes toward the contact direction with the external terminal is formed.

Therefore, when the terminal portion is pressed toward the external terminal with the bonding tool, in the protruded portion, the terminal portion is pressed strongly toward the external terminal, so that a sufficient connection of the terminal portion with respect to the external terminal can be ensured in the protruded portion.

As a result, the terminal portion can be sufficiently connected with respect to the external terminal even though the pressing force of the bonding tool is not increased.

BRIEF DESCRIPTION OF THE DRAWINGS

FIG. 4 shows process drawings for describing a process for producing the suspension board with circuit shown in FIG. 1:

(a) illustrating a step of preparing a metal supporting board, (b) illustrating a step of forming an insulating base layer on the metal supporting board, (c) illustrating a step of forming a conductive pattern on the insulating base layer, (d) illustrating a step of forming an insulating cover layer on the insulating base layer so as to cover the conductive pattern, (e) illustrating a step of etching the metal supporting board below a terminal portion, and (f) illustrating a step of etching the insulating base layer below the terminal portion.

DETAILED DESCRIPTION OF THE INVENTION

Figure 1:
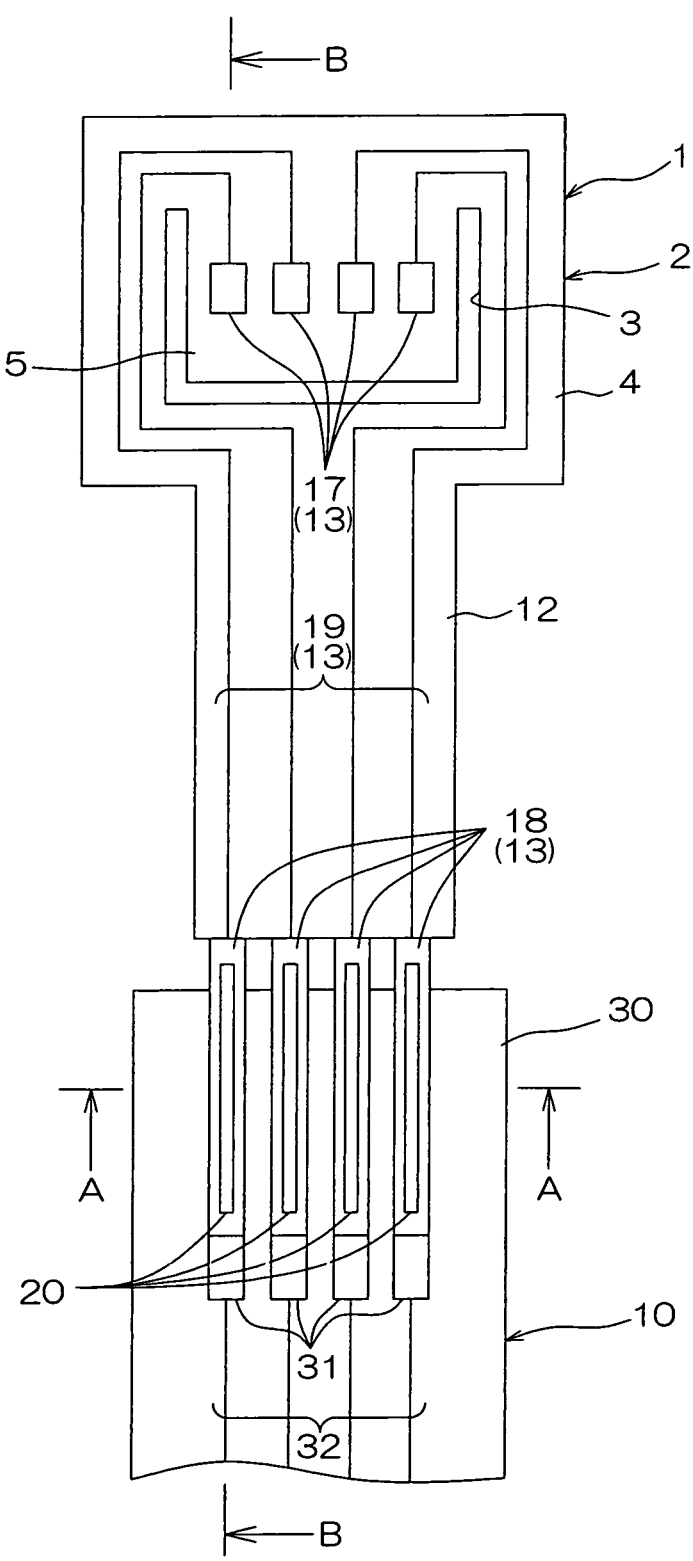
FIG. 1 shows a plan view illustrating a connection between a suspension board with circuit as one embodiment of a wired circuit board of the present invention and a relay board.
Figure 2:
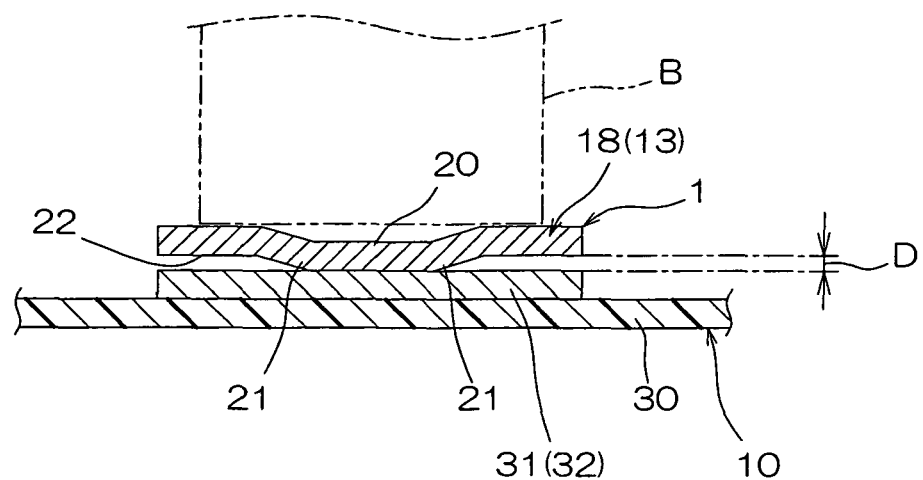
FIG. 2 shows an enlarged view of an essential part of an A-A section in FIG. 1.
Figure 3:
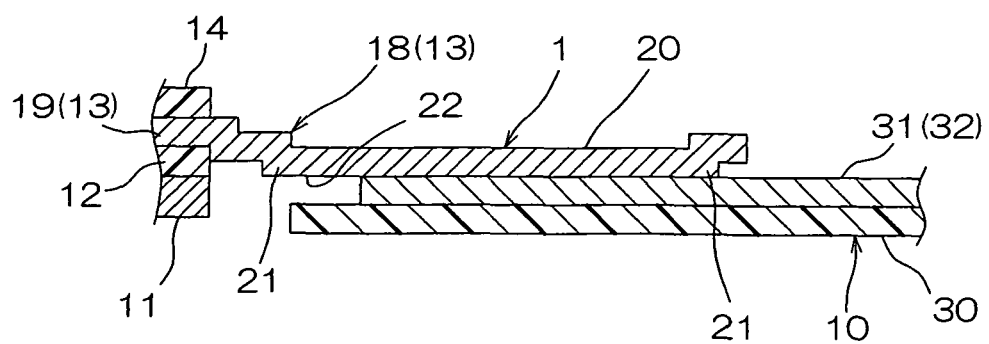
FIG. 3 shows an enlarged view of an essential part of a B-B section in FIG. 1.

FIG. 1 shows a plan view illustrating a connection between a suspension board with circuit as one embodiment of a wired circuit board of the present invention and a relay board. FIG. 2 shows an enlarged view of an essential part of an A-A section in FIG. 1. FIG. 3 shows an enlarged view of an essential part of a B-B section in FIG. 1.

As shown in FIG. 1, a suspension board with circuit 1 is formed into a generally flat belt shape extending in the lengthwise direction. In the suspension board with circuit 1, a gimbal portion 2 for mounting a slider (not shown) mounted with a magnetic head (not shown) is provided at one end portion in the lengthwise direction. The suspension board with circuit 1 is connected to a relay board 10 that is connected to a control board (not shown) at the other end portion in the lengthwise direction.

The gimbal portion 2 is formed into a generally rectangular shape in plane view. Nearly at the center of the gimbal portion 2, a slit 3 that is cut out into a generally U-shape in plane view opening toward one side in the lengthwise direction is formed. In the gimbal portion 2, an outrigger portion 4 and a tongue portion 5 are defined so as to be divided by the slit 3.

The outrigger portion 4 is, in the gimbal portion 2, outer side portions in the widthwise direction (the direction that is perpendicular to the lengthwise direction, hereinafter the same) of the slit 3 and the tongue portion 5 is, in the gimbal portion 2, an inner side portion in the widthwise direction sandwiched by the slit 3.

As shown in FIGS. 1 and 3, the suspension board with circuit 1 includes a metal supporting board 11, an insulating base layer 12 that is laminated on the metal supporting board 11, a conductive pattern 13 that is laminated on the insulating base layer 12, and an insulating cover layer 14 that is laminated on the insulating base layer 12 so as to cover the conductive pattern 13.

The metal supporting board 11 is formed into a shape corresponding to the outer shape of the suspension board with circuit 1.

The insulating base layer 12 is formed in the portion in which the conductive pattern 13 is formed and on the entire surface of the tongue portion 5.

The conductive pattern 13 extends along the lengthwise direction of the suspension board with circuit 1 and integrally includes a plurality (four pieces) of head-side terminals 17 that are connected to connecting terminals (not shown) of the magnetic head (not shown), a plurality (four pieces) of external terminals 18, as a terminal portion, that are connected to connecting terminals 31 (described later) of the relay board 10, and a plurality (four pieces) of wires 19 that connect the external terminals 18 to the corresponding head-side terminals 17, respectively.

Each of the head-side terminals 17 is formed into a generally rectangular shape in plane view (square land shape) and nearly at the lengthwise center of the tongue portion 5, is arranged in parallel at spaced intervals to each other along the widthwise direction.

Each of the external terminals 18 is, at the other end portion of the lengthwise direction in the suspension board with circuit 1, formed as a flying lead that is long and is formed into a generally flat plate shape protruding toward the other side of the lengthwise direction compared to the other end portions of the lengthwise direction in the metal supporting board 11, the insulating base layer 12, and the insulating cover layer 14. In addition, each of the external terminals 18 is arranged in parallel at spaced intervals to each other along the widthwise direction.

In each of the external terminals 18, a protruded portion 20 is formed, respectively.

The protruded portion 20 is, nearly at the widthwise center of the external terminal 18, formed into a generally rectangular shape in plane view extending over almost the entire lengthwise direction of the external terminal 18.

The protruded portion 20 is formed into a groove shape that is dented toward the lower side (that is, a groove shape having a generally U-shape opening toward the upper side) so that the lower surface thereof protrudes toward the relay board 10 (ref: FIG. 2).

That is, on a lower surface 22 of the external terminal 18, the protruded portion 20 that protrudes toward the lower side is formed.

Each of the wires 19 extends from each of the external terminals 18 toward one side in the lengthwise direction and in the gimbal portion 2, extends toward one side in the lengthwise direction with being bended so as to protrude toward the widthwise direction corresponding to the outrigger portion 4. At one end portion of the lengthwise direction in the gimbal portion 2, each of the wires 9 is folded toward the other side in the lengthwise direction and then is connected to each of the head-side terminals 17 in the tongue portion 5.

As shown in FIG. 3, the insulating cover layer 14 is formed on the insulating base layer 12 so as to cover each of the wires 19 and to expose each of the head-side terminals 17 and each of the external terminals 18.

FIG. 4 shows process drawings for describing a process for producing the suspension board with circuit shown in FIG. 1.

Next, a method for producing the suspension board with circuit 1 is described with reference to FIG. 4.

To produce the suspension board with circuit 1, as shown in FIG. 4 (a), the metal supporting board 11 is first prepared.

An example of a metal for forming the metal supporting board 11 includes stainless steel and 42-alloy. Preferably, stainless steel is used.

The metal supporting board 11 has a thickness in the range of, for example, 8 to 50 µm, or preferably 10 to 30 µm.

Next, to produce the suspension board with circuit 1, as shown in FIG. 4 (b), the insulating base layer 12 is formed on the metal supporting board 11.

An example of an insulating material for forming the insulating base layer 12 includes a synthetic resin such as polyimide, polyether nitrile, polyether sulfone, polyethylene terephthalate, polyethylene naphthalate, and polyvinyl chloride. Of these, preferably, a photosensitive synthetic resin is used, or more preferably, a photosensitive polyimide is used.

To form the insulating base layer 12 from the photosensitive synthetic resin, a varnish of a precursor of a photosensitive synthetic resin is coated on the entire surface of the metal supporting board 11 and is then dried, so that a film 40 of the precursor of the photosensitive synthetic resin is formed. Thereafter, the film 40 is subjected to a gradation exposure by using a photomask 41 having a gradation pattern consisting of a light shielding portion 41a, a light transmitting portion 41b, and a light semi-transmitting portion 41c and is then developed to form the film 40 into a pattern.

To be specific, the light transmitting portion 41b is disposed in opposed relation to the portion in which the insulating base layer 12 is formed. The light semi-transmitting portion 41c is disposed in opposed relation to the portion in which the external terminal 18 (the portion other than the protruded portion 20) is formed. The light shielding portion 41a is disposed in opposed relation to the portion in which the insulating base layer 12 is not formed (including the portion in which the protruded portion 20 is formed). Thereafter, the film 40 is exposed to light and is then developed.

Then, in the film 40, the portion that is opposed to the light shielding portion 41a is removed and in the portion that is opposed to the light transmitting portion 41b and the light semi-transmitting portion 41c, the insulating base layer 12 is formed. Among the insulating base layer 12, the portion that is opposed to the light semi-transmitting portion 41c has the thickness that is thinner than that of the portion that is opposed to the light transmitting portion 41b, corresponding to the external terminal 18 (the portion other than the protruded portion 20).

Next, when the film 40 that is formed into a pattern is cured (imidized) by heating, the insulating base layer 12 made of polyimide is formed with a predetermined pattern.

In the above-described method, the photomask 41 with a gradation pattern is used. Alternatively, for example, by using a plurality of photomasks with different patterns (for example, by using a photomask with a pattern in which the portion that forms the external terminal 18 (the portion other than the protruded portion 20) is exposed to light and a photomask with a pattern that is not exposed to light), the film 40 can be sequentially exposed to light at least two or more times.

In addition, in the formation of the insulating base layer 12, when a photosensitive resin is not used, for example, a resin may be laminated on the metal supporting board 11 in a predetermined pattern as a coating or a dry film. To be specific, the resin is laminated in multiple times and in the portion in which the external terminal 18 (the portion other than the protruded portion 20) is formed, the resin is laminated in less times than in other portions.

The insulating base layer 12 (except for the portion in which the external terminal 18 is formed) has a thickness in the range of, for example, 3 to 20 μm, or preferably 4 to 12 μm.

The portion in which the external terminal 18 of the insulating base layer 12 is formed has the following size distribution: the thickness in the range of, for example, 1 to 8 μm, or preferably 1 to 5 μm; the length in the lengthwise direction in the range of, for example, 300 to 3000 μm, or preferably 500 to 2000 μm; and the length in the widthwise direction in the range of, for example, 30 to 300 μm, or preferably 50 to 150 μm.

The portion in which the insulating base layer 12 is not formed and the protruded portion 20 is formed has the following length distribution: the length in the lengthwise direction in the range of, for example, 240 to 2400 μm, or preferably 400 to 1600 μm and the length in the widthwise direction in the range of, for example, 10 to 280 μm, or preferably 30 to 130 μM.

Next, to produce the suspension board with circuit 1, as shown in FIG. 4 (c), the conductive pattern 13 is formed on the insulating base layer 12.

An example of a conductive material for forming the conductive pattern 13 includes the conductive material such as copper, nickel, gold, tin, solder, or alloys thereof. Preferably, copper is used.

To form the conductive pattern 13, for example, a known patterning method such as an additive method or a subtractive method is used. Preferably, the additive method is used.

In the additive method, to be specific, a conductive seed film is first formed on the top surface of the metal supporting board 11 including the insulating base layer 12 by a sputtering method and the like. Next, a plating resist is formed on the top surface of the conductive seed film in a pattern that is reverse to that of the conductive pattern 13. Thereafter, the conductive pattern 13 is formed on the top surface of the conductive seed film of the insulating base layer 12 that is exposed from the plating resist by electrolytic plating. Subsequently, the plating resist and the portion of the conductive seed film on which the plating resist is laminated are removed.

The conductive pattern 13 has a thickness in the range of, for example, 3 to 50 μm, or preferably 5 to 25 μm.

The wire 19 has a length in the widthwise direction in the range of, for example, 10 to 100 μm, or preferably 12 to 50 μm. A spacing between each of the wires 19 is in the range of, for example, 10 to 100 μm, or preferably 12 to 50 μm.

The head-side terminal 17 has a length in the widthwise direction in the range of, for example, 10 to 100 μM, or preferably 12 to 50 μm. A spacing between each of the head-side terminals 17 is in the range of, for example, 10 to 100 μm, or preferably 12 to 50 μm.

Next, to produce the suspension board with circuit 1, as shown in FIG. 4 (d), the insulating cover layer 14 is formed on the insulating base layer 12 so as to cover the conductive pattern 13. The insulating material for forming the insulating cover layer 14 includes the same insulating material as that for the insulating base layer 12.

To form the insulating cover layer 14, for example, a solution of a photosensitive synthetic resin is applied onto the top surface of the insulating base layer 12 including the conductive pattern 13 and is then dried. Thereafter, the dried resin is exposed to light with the above-described pattern and is then developed to be heat cured as required.

Furthermore, the insulating cover layer 14 can also be formed, for example, by preliminarily forming a synthetic resin into a film having the above-described pattern and adhesively bonding the film to the top surface of the insulating base layer 12 including the conductive pattern 13 via a known adhesive layer.

The insulating cover layer 14 has a thickness in the range of, for example, 2 to 25 μm, or preferably 3 to 10 μm.

Next, to produce the suspension board with circuit 1, as shown in FIG. 4 (e), the metal supporting board 11 is etched in the gimbal portion 2 to form the slit 3 and the metal supporting board 11 is etched at the other end portion of the lengthwise direction in the suspension board with circuit 1 to expose the lower surfaces of the insulating base layer 12 (the portion in which the external terminal 18 is formed) and the conductive pattern 13 (the portion in which the protruded portion 20 is formed) from the metal supporting board 11.

The etching of the metal supporting board 11 may be performed by a known method. For example, the entire portion other than the portion in which the slit 3 is formed is subjected to a masking and then to a chemical etching.

To be specific, for example, by using an aqueous ferric chloride solution and the like as an etchant, a wet etching (chemical etching) method is used with spray or dipping.

In this way, in the gimbal portion 2, the slit 3 is formed, so that the outrigger portion 4 and the tongue portion 5 are defined. At the other end portion of the lengthwise direction in the suspension board with circuit 1, the lower surfaces of the insulating base layer 12 (the portion in which the external terminal 18 is formed) and the conductive pattern 13 (the portion in which the protruded portion 20 is formed) are exposed from the metal supporting board 11.

The slit 3 has a slit width in the range of, for example, 30 to 1000 μm, or preferably 50 to 500 μm.

The tongue portion 5 has a length in the widthwise direction in the range of, for example, 200 to 2000 μm, or preferably 20 to 1000 μm.

Each of the outrigger portions 4 has a length in the widthwise direction in the range of, for example, 30 to 500 or preferably 50 to 300 μm.

Next, as shown in FIG. 4 (f), the insulating base layer 12 that is exposed from the metal supporting board 11 is etched until the lower surface of the external terminal 18 (the portion other than the protruded portion 20) is exposed.

The etching of the insulating base layer 12 may be performed by a known method. For example, the insulating base layer 12 is formed by a chemical etching, a plasma etching, or the like. Preferably, the insulating base layer 12 is formed by the chemical etching. The chemical etching may be performed by a known method. For example, an alkaline etching is performed by, using the metal supporting board 11 as an etching resist.

In this way, the lower surface of the external terminal 18 (the portion other than the protruded portion 20) is exposed, so that the external terminal 18 is formed as a flying lead in which when projected in the up-down direction, the lower surface thereof is exposed from the metal supporting board 11 and the insulating baser layer 12, and the upper surface thereof is exposed from the insulating cover layer 14.

A difference in level D (ref: FIG. 2) between the lower surface of the portion in which the protruded portion 20 is not formed in the external terminal 18 and the lower surface of the protruded portion 20 is in the range of, for example, 1 to 8 μm, or preferably 1 to 5 μm.

The difference in level D with respect to the thickness of the insulating base layer 12 is in the range of, for example, 80% or less, preferably 50% or less, or more preferably 10 to 30%.

The external terminal 18 has a length in the lengthwise direction in the range of, for example, 300 to 3000 μm, or preferably 500 to 2000 μm and has a length in the widthwise direction in the range of, for example, 30 to 300 μm, or preferably 50 to 150 μm. A spacing between each of the external terminals 18 is in the range of, for example, 10 to 200 μm, or preferably 12 to 100 μm.

The protruded portion 20 has a length in the lengthwise direction in the range of, for example, 240 to 2400 μm, or preferably 400 to 1600 μm and has a length in the widthwise direction in the range of, for example, 10 to 280 μm, or preferably 30 to 130 μm.

When the protruded portion 20 is projected in the up-down direction, the area thereof is in the range of, for example, 10 to 90%, or preferably 20 to 50% with respect to that of the lower surface 22 of the external terminal 18.

Next, in this method, the head-side terminal 17 and the external terminal 18 are plated as required.

A plating method and a metal used in the plating are not particularly limited. For example, by sequentially performing an electrolytic nickel plating and an electrolytic gold plating, a nickel plating layer and a gold plating layer are laminated.

The nickel plating layer and the gold plating layer each have a thickness preferably about in the range of 1 to 5 μm.

The suspension board with circuit 1 is produced in this manner.

As shown in FIGS. 1 and 2, the suspension board with circuit 1 is connected with respect to the relay board 10 so as to be overlapped from above.

The relay board 10 is formed into a generally flat belt shape extending in the lengthwise direction and includes an insulating base layer 30 and a conductive pattern 32.

The insulating base layer 30 is formed from the same resin material as that for the insulating base layer 12 of the suspension board with circuit 1.

The conductive pattern 32 is formed from the same conductive material as that for the conductive pattern 13 of the suspension board with circuit 1 and has a plurality (four pieces) of the connecting terminals 31, as external terminals, corresponding to the external terminals 18 of the suspension board with circuit 1.

In order to connect the suspension board with circuit 1 to the relay board 10, as shown in FIGS. 2 and 3, first, the suspension board with circuit 1 comes into contact with respect to the relay board 10 from above so that the lower surface of the protruded portion 20 of each of the external terminals 18 is in contact with the upper surface of each of the connecting terminals 31. That is, the lower surface 22 of each of the external terminals 18 functions as an exposed surface that is exposed toward the connecting terminal 31 side.

Next, a bonding tool B comes into contact with the upper surface of the external terminal 18 and is pressed toward the lower side, and the ultrasonic vibration is applied thereto.

In this way, the external terminal 18 of the suspension board with circuit 1 is connected to the connecting terminal 31 of the relay board 10.

According to the suspension board with circuit 1, in the lower surface 22 of the external terminal 18 that comes into contact with the connecting terminal 31 of the relay board 10, the protruded portion 20 that protrudes toward the contact direction (that is, the lower side) with the connecting terminal 31 is formed.

Therefore, when the external terminal 18 is pressed toward the connecting terminal 31 with the bonding tool B, in the protruded portion 20 (in particular, a step portion 21 in which a step is formed in the both lengthwise end portions and the both widthwise end portions of the protruded portion 20), the external terminal 18 is pressed strongly toward the connecting terminal 31. In this way, a sufficient connection of the external terminal 18 with respect to the connecting terminal 31 can be ensured in the protruded portion 20.

As a result, the external terminal 18 can be sufficiently connected with respect to the connecting terminal 31 even though the pressing force of the bonding tool B is not increased.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A wired circuit board comprising:
an insulating base layer,
a conductive pattern that is laminated on the insulating base layer, and
an insulating cover layer that is laminated on the insulating base layer so as to cover the conductive pattern,
wherein the conductive pattern includes, a terminal potion that is formed as a flying lead whose lower surface is exposed from the insulating base layer and whose upper surface is exposed from the insulating cover layer,
wherein the terminal portion includes an exposed surface that is exposed toward an external connecting terminal side;
wherein a protruded portion is formed on the exposed surface of the terminal portion and protrudes toward a contact direction for connection with an external connecting terminal;
wherein the protruded portion is contained entirely within the exposed surface of the terminal portion, and
wherein the protruded portion has a generally rectangular shape which extends in a lengthwise direction and a widthwise direction of the exposed surface of the terminal portion, and wherein longitudinal ends and widthwise sides of the protruded portion are spaced apart from a perimeter of the exposed surface of the terminal portion.

2. The wired circuit board according to claim 1, wherein the protruded portion has a difference in level that is 80% or less with respect to a thickness of the insulating base layer.

3. The wired circuit board according to claim 1, wherein when the protruded portion is projected in an up-down direction, the area thereof is in the range of 10 to 90% with respect to that of the exposed surface.

4. The wired circuit board according to claim 1, wherein the protruded portion is dented toward the contact direction.

* * * * *